April 11, 1961 S. P. HELD 2,979,612

ELECTRONIC AMPLIFIER CIRCUITS

Filed July 7, 1958 3 Sheets-Sheet 1

INVENTOR:
Sidney P. Held
By Gene W. Arant
Attorney.

April 11, 1961 S. P. HELD 2,979,612

ELECTRONIC AMPLIFIER CIRCUITS

Filed July 7, 1958 3 Sheets-Sheet 2

INVENTOR:
Sidney P. Held
By Gene W. Arant
Attorney.

ELECTRONIC AMPLIFIER CIRCUITS

Filed July 7, 1958 3 Sheets-Sheet 3

INVENTOR:
Sidney P. Held
By Gene W. Arant
Attorney

United States Patent Office 2,979,612
Patented Apr. 11, 1961

2,979,612

ELECTRONIC AMPLIFIER CIRCUITS

Sidney P. Held, Manhattan Beach, Calif., assignor to Nova-Tech, Inc., a corporation of California Filed July 7, 1958, Ser. No. 746,937
6 Claims. (Cl. 250—20)

The present invention relates to an amplifier including two or more stages which are arranged to operate in cascade for amplifying a signal of one frequency, and to operate in parallel for amplifying another signal of a substantially different frequency.

The present application is a continuation-in-part of my copending application Serial No. 687,908, filed October 3, 1957, now Patent Number 2,843,735.

In some applications of electronic circuitry, as for example, in amplifying musical sound, faithful reproduction of a wide range of frequencies is essential to achieve the desired level of quality. Where electronic equipment is utilized for control purposes, or for transmitting, amplifying or reproducing signals occupying a limited frequency range, the fidelity or quality of the circuit response is of much less importance. The present invention is more concerned with the efficient utilization of circuit components than with high quality or high fidelity response.

According to the present invention novel amplifier circuits are provided which are capable of performing a double function. While a double function is not in itself a new concept it is nevertheless true that most electronic circuits which are adapted to perform two or more different functions require switching of the circuit connections so that certain circuit components utilized during one mode of operation are excluded from the circuit for another mode of operation, and vice versa.

One object of the invention, therefore, is to provide an amplifier circuit which is capable of performing two entirely distinct amplification functions and which may be used for the two functions alternately without the need for any switching of circuit connections.

Another object of the invention is to provide an ampliler circuit including two or more stages which are adapted to operate in cascade for amplifying a signal of one frequency and to concurrently operate in parallel for amplifying another signal having a substantially different frequency.

Still another object of the invention is to provide an amplifier circuit including at least two amplifier stages adapted to operate in cascade for amplifying a modulated high frequency signal, and at the very same time to operate in parallel for amplifying a low frequency signal.

Yet another object of the invention is to provide an improvement in a radio receiving system, by utilizing certain amplifier stages thereof for concurrently amplifying both the modulated carrier signal and the intelligence signal which has been derived therefrom.

Still a further object of the invention is to provide a radio receiving system in which automatic volume control is applied only to certain operating stages, while certain other operating stages are utilized, in addition to their normal functions, to operate as parallel amplifiers for amplifying the intelligence signal.

The above and other objects of the invention will be mode clearly apparent from the following description considered in conjunction with the accompanying drawings in which.

Before resorting to detailed description of the drawings it will be helpful to explain that my invention has already been tested and proven successful in a certain particular application, namely, in a radio transmitter-receiver designed for short range speech transmission. The novel circuits of my invention are destined to find many other useful applications, however, as will become apparent from the following description.

The use of the invention in a radio transmitter-receiver designed for short range speech transmission will first be described in general terms. When messages are to be transmitted, the novel circuit of the present invention acts as an audio amplifier, receiving an audio signal from a source such as a microphone circuit and providing sufficient amplification thereof so as to modulate the radio frequency power amplifier from which the modulated carrier wave is in turn supplied to the antenna. When messages are to be received, on the other hand, the novel circuit of the present invention receives the modulated intermediate frequency carrier wave (which has previously been derived from the radio frequency carrier by means of a conventional local oscillator and mixer arrangement), amplifies the IF carrier, and after rectification of the IF carrier to detect the audio signal therefrom, amplifies the audio signal sufficiently to drive a suitable output circuit such as a pair of head phones.

Figure 1:
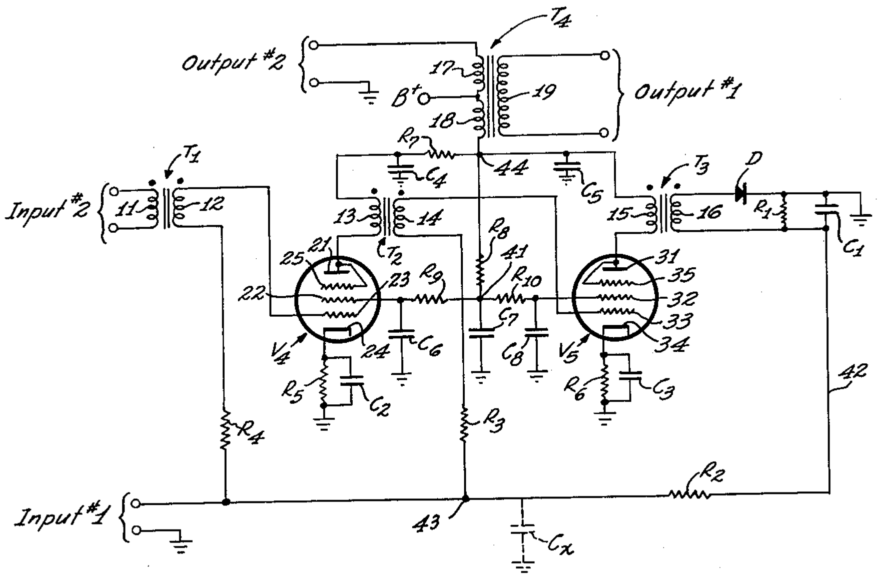
Figure 1 is a schematic diagram of a particular vacuum tube circuit incorporating my invention.

Reference is now made to Figure 1 of the drawings, which illustrates a particular form in which my invention is adapted for use in a radio transmitter-receiver. The circuit of Figure 1 includes a pair of vacuum tube pentodes $V_4$ and $V_5$ which are so arranged as to operate in cascade for the purpose of IF amplification and, at the very same time, to operate in parallel for the purpose of AF amplification.

Transformers $T_1$, $T_2$ and $T_3$ are IF coupling transformers each having a 1:1 ratio. Primary winding 11 of transformer $T_1$ is connected to a pair of terminals representing input circuit No. 2, as will be subsequently explained. Secondary winding 12 of transformer $T_1$ has one end connected to control grid 23 of tube $V_4$ while its other end is connected to a resistor $R_4$. Cathode 24 of tube $V_4$ is connected to ground through a bias resistor $R_5$ having a by-pass capacitor $C_2$ in parallel therewith. Primary winding 13 of transformer $T_2$ has one end connected to plate 21 of $V_4$ and its other end receiving direct current from an energizing source as will be explained. Secondary winding 14 of transformer $T_2$ has one end connected to control grid 33 of tube $V_5$ and its other end connected to a resistor $R_3$.

As indicated by the polarity markings, there is no inversion of an alternating voltage signal passing through transformer $T_2$ or $T_3$. That is, a positive signal applied to the upper end of the primary winding induces in the secondary winding a signal which is positive at the upper end of the winding and negative at the lower end.

The other ends of resistors $R_3$ and $R_4$ are connected to each other by means of a conductor 43 forming one terminal of input circuit No. 1, whose other terminal is connected to ground. Conductor 43 is connected to a resistor $R_2$ whose other end is connected to a conductor 42 representing the volume control voltage and AF feedback path. A capacitor $C_x$ shown connected by dotted lines between conductor 43 and ground does not form a part of the present circuit, but is illustrated in order to point out that the AF by-pass capacitor which is conventionally used in an automatic volume control (AVC) feedback circuit is omitted in the feedback circuit associated with the present invention.

Control grid 33 of tube $V_5$ is biased by means of a bias resistor $R_6$ which connects cathode 34 to ground, together with a by-pass capacitor $C_3$ in parallel with $R_6$. Suppressor grids 25 and 35 of tubes $V_4$ and $V_5$, respectively, are tied internally to the respective plates thereof.

Transformer $T_3$ has one end of its primary winding 15 connected to plate 31 of tube $V_5$ while the other end receives direct current from the power supply. Secondary winding 16 of transformer $T_3$ has one end connected to the anode of a rectifier D, a filter circuit comprising the parallel combination of a resistor $R_1$ and a capacitor $C_1$ being connected between the cathode of rectifier D and feedback conductor 42. The other end of winding 16 is also connected to conductor 42. A ground connection is made at the point of interconnection between diode D, capacitor $C_1$ and resistor $R_1$.

A terminal B+ represents the positive terminal of a power supply circuit or other source of direct energizing potential. An output transformer $T_4$ having two series connected primary windings 17 and 18 has also a secondary winding 19 representing output circuit No. 1. The end of winding 17 which is not connected to winding 18 represents one terminal of output circuit No. 2, whose other terminal is ground. The B+ terminal is connected to the junction between windings 17 and 18, and current flowing through winding 18 provides operating potentials for the plates and the screen grids of tubes $V_4$ and $V_5$, as will be described.

The other end of winding 18 is connected directly to the other end of winding 15 and is also connected through a resistor $R_7$ to the other end of winding 13. By-pass capacitor $C_4$ is connected between the positive end of winding 13 and ground while a by-pass capacitor $C_5$ in similar manner is connected between the positive end of winding 15 and ground. The junction point representing the common connection of resistor $R_7$, winding 18, capacitor $C_5$ and winding 15 is for convenience designated as 44. A resistor $R_8$ is connected between junction point 44 and another junction point identified as 41. Junction point 41 is by-passed directly to ground through a capacitor $C_7$. A resistor $R_9$ interconnects junction point 41 with screen grid 22 of tube $V_4$ for the purpose of supplying a bias potential thereto, and screen grid 22 is also by-passed to ground through a capacitor $C_6$. Screen grid 32 of tube $V_5$ is by-passed to ground through a capacitor $C_8$ and receives operating potential from a resistor $R_{10}$ connected to junction point 41.

In operation, input circuit No. 1 and output circuit No. 1 are used when it is desired to operate the radio set as a transmitter. An audio signal supplied from a microphone circuit or equivalent source is applied to input circuit No. 1, is amplified, by the two tubes operating in parallel, and passes through output circuit No. 1 to the radio frequency power amplifier. During the receive operation input circuit No. 1 and output circuit No. 1 are not used and may be disconnected or otherwise rendered ineffectual.

When it is desired to operate the radio set as a receiver, a modulated IF carrier is applied to input circuit No. 2 and the audio output signal appearing at output circuit No. 2 is used to drive a pair of head phones or equivalent load. Input circuit No. 2 and output circuit No. 2 are not used during the transmit operation and may be disconnected or otherwise rendered ineffectual.

Although the power supply terminal B+ is shown as a single terminal, it in fact is preferred to have two different values of operating voltage, one for transmit and the other for receive. By the same token it is not absolutely necessary to have two separate output circuits except on the assumption that the impedance and other circuit conditions are different for the transmit operation and the receive operation, which is generally the case.

Although it is to be understood that other circuit values may be used, a set of circuit values which have been found in actual usage to provide satisfactory operation of the circuit of Figure 1 are listed as follows:

| | |
|---|---|
| $T_1$, $T_2$, $T_3$ | All are 1 : 1 ratio IF transformers having a powdered iron core, 5 turns per winding. |
| $T_4$ | All three windings are equal (each 5000 ohms); heavy iron core. |
| $V_4$, $V_5$ | Type 6AW8 (internally connected suppressor). |
| $R_1$ | 150K. |
| $R_2$ | 180K. |
| $R_3$, $R_4$ | 220K. |
| $R_5$, $R_6$ | 100K. |
| $R_7$, $R_8$, $R_9$, $R_{10}$ | 1K. |
| $C_1$ | 82$\mu\mu$f. |
| $C_2$, $C_3$ | 0.01$\mu$f. |
| $C_4$, $C_5$, $C_6$, $C_7$, $C_8$ | 0.001$\mu$f.=$\mu\mu$f. |
| D | Crystal diode. |
| B+ | (Transmit +300 volts), (Receive +150 volts). |
| IF frequency | 10 megacycles. |
| AF frequency | 50 to 4000 c.p.s. |

The circuit operation for the receive condition will now be briefly traced. A modulated IF carrier wave supplied to input circuit No. 2 passes through transformer $T_1$ to control grid 23 of tube $V_4$. The amplified signal appears at plate 21 of tube $V_4$ and is applied through transformer $T_2$ to grid 33 of tube $V_5$. The further amplified signal appearing at plate 31 passes through transformer $T_3$ to the detector circuit where it is rectified and filtered. The time-constant of the filter circuit is of the order of 10 microseconds and hence eliminates the IF but not the AF. Feedback conductor 42 therefore receives a varying direct voltage for regulating the bias on control grids 23 and 33, and for thus automatically controlling the volume of the amplified signal. Feedback conductor 42 also receives the AF signal which, as previously pointed out, is not disposed of either by $C_x$ or by any equivalent by-pass capacitor associated with the circuits connected to input circuit No. 1. The AF signal is amplified by tubes $V_4$ and $V_5$ operating in parallel and, through auto-transformer action, appears at output circuit No. 2. It should be noted that so long as the filtering action in the rectifier and filter circuit is sufficient for the IF there is no appreciable difficulty with spurious oscillations due to feeding back the AF signal, regardless of its phase relative to the IF signal. Resistors $R_7$, $R_8$, $R_9$ and $R_{10}$ and capacitors $C_4$, $C_5$, $C_6$, $C_7$ and $C_8$ are included in the circuit, however, very largely for the purpose of eliminating undesirable oscillations as well as for the purpose of providing proper screen grid biasing.

During transmit the operation is much simpler. The audio signal applied to input circuit No. 1 is amplified by tubes $V_4$ and $V_5$ in parallel. The same signal is supplied to both grids, through $R_4$ and the secondary winding 12 of $T_1$ in the case of $V_4$, and through $R_3$ and the secondary winding 14 of $T_2$ in the case of $V_5$. The amplified signals appear in the output No. 1 windings of $T_4$.

Since the impedance of the IF transformers $T_2$ and $T_3$ is approximately zero at audio frequencies, no appreciable voltage appears across secondary winding 16 of transformer $T_3$. Any feedback voltage generated on conductor 42, therefore, is small enough to be neglected.

With further reference to the receive operation, primary winding 18 of transformer $T_4$ presents to the IF frequency a practically infinite impedance, whereas primary winding 15 of transformer $T_3$ presents to audio frequencies approximately zero impedance. Thus, in the amplifier circuit itself the amplification of the IF and the AF frequencies are carried on almost entirely independently of each other, while the feedback loop (including the detector circuit) accepts only the IF frequency as its driving signal and produces only the AF signal (together with a slowly varying D.C. voltage for volume control) as its output signal.

Tubes $V_4$ and $V_5$ operate in normal pentode fashion for the purpose of IF amplification, but operate substantially as triodes for audio amplification. One reason for this is that the screen grid by-passing provided by capacitors $C_6$ and $C_8$, adequate at IF frequency, is wholly inadequate at the audio frequency resulting in screen grid degeneration and loss of amplification. Another reason is that resistors $R_7$, $R_8$, $R_9$ and $R_{10}$ are so small that the screen grids can be considered to be directly connected to the upper ends of primary windings 13 and 15 of transformers $T_2$ and $T_3$. Since these windings have approximately zero impedance at audio frequencies, the screen grids are for all intents and purposes directly connected to their respective plates.

The operation of the tubes substantially as triodes for audio frequencies is used to good advantage during the transmit operation, for the tubes then have a remote cut-off characteristic rather than a sharp cut-off as exhibited by the same tubes operating as pentodes. The remote cut-off characteristic causes the audio amplifier circuit to act very much like a compressor. Hence it is not necessary to regulate or restrict the amplitude range of the audio input signal. This is very advantageous in aircraft usage since considerable noise may be involved and the person speaking into the transmitting microphone is then permitted to shout if necessary in order to override the noise level.

Figure 2:
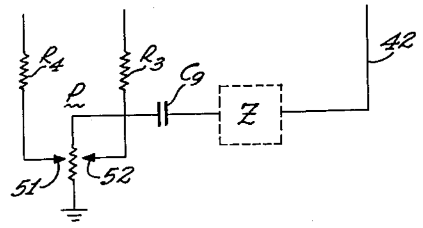
Figure 2 illustrates an alternate form of a certain portion of the circuit of Figure 1.

Reference is now made to Figure 2 which illustrates a modified form of the feed-back circuit of Figure 1. A dotted box Z represents an impedance which is included in the feed-back circuit and may have any of several specific forms. Conductor 42 is connected to box Z which is also grounded, and a third terminal of box Z is coupled through a capacitor $C_9$ to a potentiometer P. Resistors $R_4$ and $R_3$ are connected to potentiometer P by means of variable taps 51 and 52 respectively. By virtue of the series capacitor $C_9$ the circuit of Figure 2 is adapted for feeding back only the intelligence or audio signal to the control grids of tubes $V_4$ and $V_5$.

It is convenient, however, to supply an automatic volume control signal to one or more operating stages which precede the intermediate frequency amplifiers. This may be accomplished, for example, by incorporating into box Z a noise clipper tube having two separate outputs, one of which is utilized to supply the intelligence signal to capacitor $C_9$ while the other is utilized to supply the automatic volume control voltage to preceding operating stages.

In the circuit of Figure 2 the use of variable taps 51 and 52 in conjunction with potentiometer P makes it possible to feed differing voltage values of the intelligence signal to the two amplifier control grids. Assuming that tubes $V_4$ and $V_5$ have identical characteristics, since the high frequency signal has a greater amplitude in the circuit of tube $V_5$ than it has in the circuit of tube $V_4$ it accordingly consumes a larger portion of the distortion-free capacity of tube $V_5$. It may therefore be advantageous to supply a stronger audio signal to tube $V_4$ which has more unused capacity available for amplifying the audio signal.

When transistors are utilized in the circuit in lieu of vacuum tubes it may likewise be advantageous to feed back the intelligence signal in greater strength to the amplifier stage which accepts the high frequency signal at its lowest level.

Figure 3:
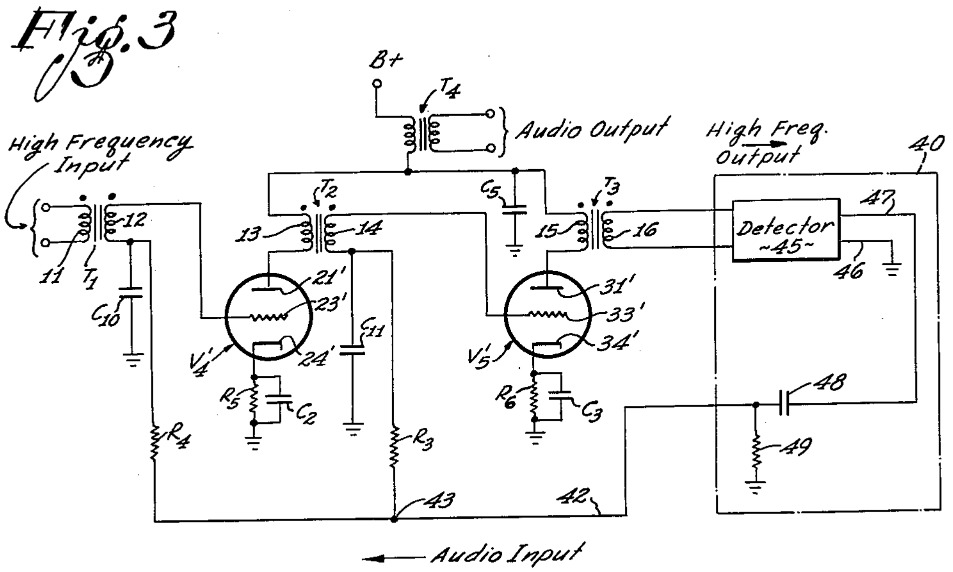
Figure 3 is a schematic diagram illustrating a general form of vacuum tube circuit incorporating my invention.

Reference is now made to Figure 3 which illustrates a generalized form of vacuum tube circuit incorporating my invention. Like reference numerals are used to identify like parts or components as are used in the circuit of Figure 1, while a prime following the reference character indicates a modified form or value of the particular part or component.

A dotted box 40 in Figure 3 includes detector and feed-back circuits which, although they have been incorporated in the particular application in which my invention has heretofore been used, are not necessarily a part of my invention. Other applications of my invention which do not require the use of either a detector or a feed-back circuit will be mentioned in a later paragraph.

In Figure 3 the primary winding 11 of transformer $T_1$ provides the high frequency input circuit while secondary winding 16 of transistor $T_3$ provides the high frequency output circuit. Conductor 42 represents the input line for audio or other low frequency signals which after amplification are delivered to a load through the secondary winding of transformer $T_4'$.

The high frequency circuit and the low frequency circuit can be operated concurrently although the two operations may not necessarily be related in any way to each other. For example, in an industrial control application, it may be desirable to incorporate as part of a moving machine a small electronic circuitry package having several different functions. One function of the package may be to transmit computer or other intelligence information which is modulated upon a high frequency carrier. Another function of the electronic package may be to deliver a heavy surge of current when a predetermined combination of control conditions occurs. My invention can be advantageously used for a purpose such as this, with amplification of the high frequency signal being performed by the two tubes acting serially while the control voltage generated in a separate logical gating circuit is applied to conductor 42 to operate the two tubes in parallel.

In Figure 3 by-pass capacitors $C_{10}$ and $C_{11}$ are used in conjunction with the secondary windings of transistors $T_1$ and $T_2$, respectively, in order to preclude the high frequency signals from passing into the feedback circuit. The tubes $V_4'$ and $V_5'$ are illustrated as triodes, the other features of the circuit being basically the same as in Figure 1. In Figure 3 the detector and feedback circuits 40 are illustrated in very general form. A detector 45 is coupled to secondary winding 16 of transistor $T_3$, and has one output line 46 grounded while the other output line 47 is coupled through capacitor 48 and resistor 49 to ground. Conductor 42 is connected to the junction between capacitor 48 and resistor 49. The use of capacitor 48 precludes any direct voltage component from being included in the feedback signal applied to the control grids of the two tubes.

Figure 4:
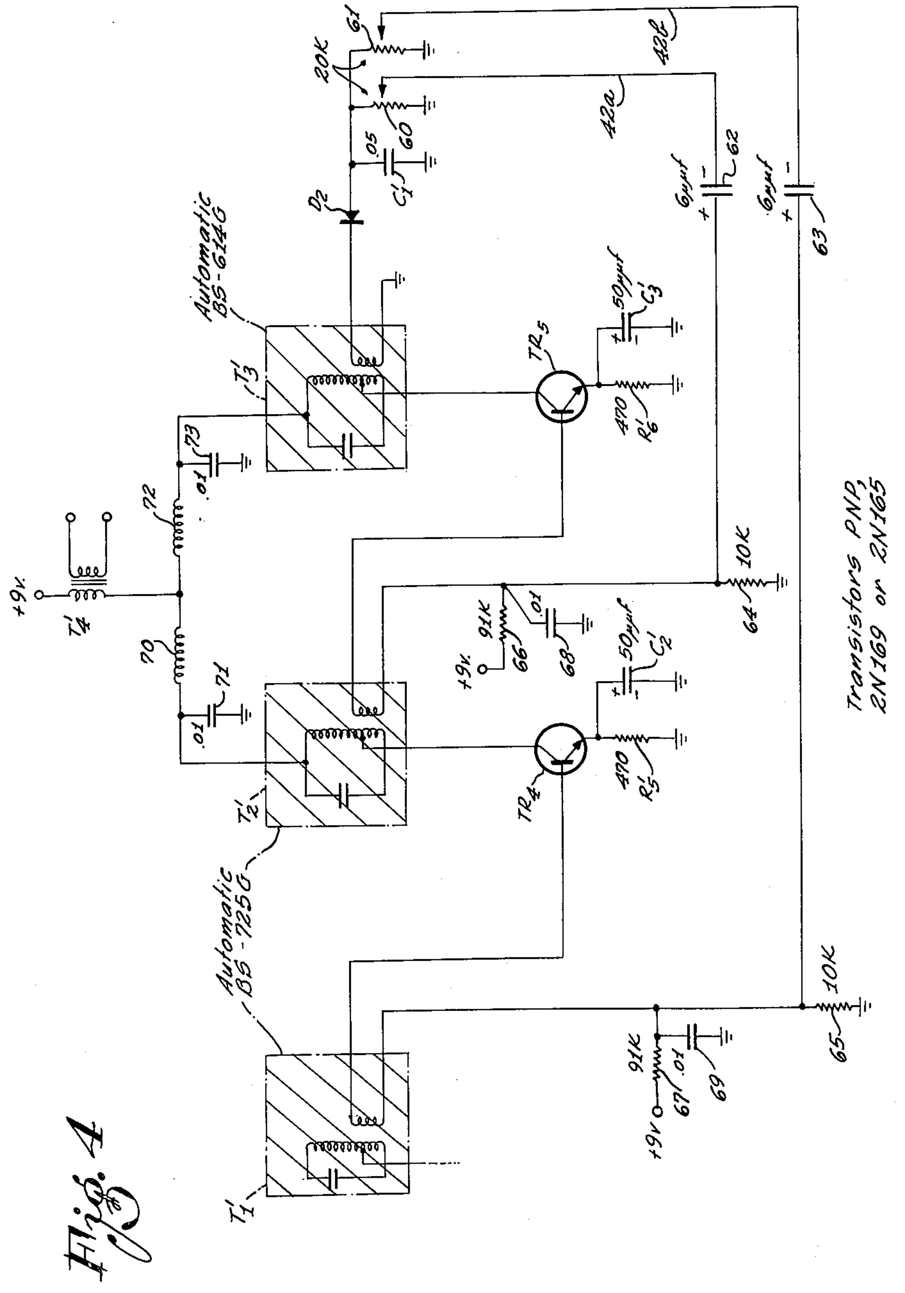
Figure 4 is a schematic diagram of a transistor circuit in accordance with the invention.

Reference is now made to Figure 4 illustrating a transistor circuit incorporating my invention. High frequency transformers $T_1'$, $T_2'$ and $T_3'$ are selected to have characteristics suitable for use in conjunction with the particular transistor. A transistor $TR_4$ provides the first amplifier stage while a transistor $TR^5$ provides the second amplifier stage. A radio frequency choke 70 couples the primary winding of transformer $T_2'$ to the primary winding of low frequency output transformer $T_4'$, while a bypass capacitor 71 connected to the primary winding of $T_2'$ provides a shunt path to keep the high frequency signals out of the low frequency transformer $T_4'$. A similar choke coil 72 couples the primary winding of $T_3'$ to the primary winding of $T_4'$ and a capacitor 73 provides the associated bypass circuit.

In the detector circuit a diode $D_2$ has its cathode connected to one end of the secondary winding of transformer $T_3'$, the other end of which is grounded. A capacitor $C_1'$ is connected between the anode of $D_2$ and ground. A pair of potentiometer resistors 60 and 61 are connected between the anode of $D_2$ and ground and are respectively provided with variable taps to which conductors 42A, 42B are connected. Conductor 42A is coupled through a series capacitor 62 and resistor 64 to ground, the junction between capacitor 62 and resistor 64 being connected through the secondary winding of transformer $T_2'$ to the base of transistor $TR_5$. In similar manner conductor 42B is coupled through capacitor 63 to the secondary winding of transformer $T_1'$ and also to resistor 65 whose other end is grounded. A resistor 66 is coupled between a 9 volt power supply and the floating end of resistor 64 for the purpose of biasing the latter and, in turn, placing a positive operating bias upon the base of transistor $TR_5$. A grounded bypass capacitor 68 connected to the junction between resistors 66 and 64 prevents the audio signal from entering the power supply. In similar manner a resistor 67 together with a bypass capacitor 69 provides a bias for resistor 65 and the base of transistor $TR_4$.

In the circuit of Figure 4 the use of potentiometers 60 and 61 permits the application of differing voltage values of the audio signal to transistors $TR_4$ and $TR_5$. As in the case of the vacuum tube circuit it is preferred to apply the strong audio signal to the amplifier stage which has the least amount of its capacity consumed by the high frequency signal, which in this case is transistor $TR_4$.

Having described the detailed circuits embodying my invention as illustrated in Figures 1 to 4, inclusive, it is now appropriate to make certain observations about the ways in which my invention may be used. My invention of course is not limited to the use of two amplifier stages but may be extended equally well to three or more amplifier stages. That is, a high frequency signal may be amplified by three or more amplifier stages which accept a signal sequentially, and the same amplifier stages may be operated concurrently in parallel to amplify a low frequency signal.

While a principal example of the use of my invention is in a radio receiver system, it will be understood that many other applications are possible and that any two signals may be concurrently amplified through the use of my invention so long as there is a substantial frequency difference between them. Furthermore, my invention is equally valuable in certain applications where the high frequency and low frequency amplifications are to be performed alternately rather than concurrently, since a very substantial saving in circuit components is achieved without the need for switching the circuit connections when changing from one mode of operation to the other.

The provision in the feedback circuit for supplying signals of unequal strength to the different amplifier stages (see Figures 2 and 4) is not at all necessary to the utilization of my invention, but is merely an added feature which may be useful in some applications. Where the characteristics of the serially arranged tubes or transistors are identical it will generally be preferred to supply a stronger low frequency signal to the amplifier stage which carries the smallest high frequency load. Under other circumstances it may be desired, however, to feed the strong low frequency signal to the later amplifier stage.

Figure 1 has illustrated a circuit for use in a radio receiver, where a slowly varying direct voltage signal and an audio frequency signal are fed back at the same time and through the same circuit to both of the amplifiers $V_4$ and $V_5$. While this type of operation is permissible it is probably subject to some objection since the very use of the automatic volume control signal implies that the vacuum tubes are operating in a non-linear region of their characteristics. It is therefore to be expected that appreciable distortion would occur in amplifying the audio frequency signals. It is in general preferred in a radio receiver to segregate the use of the invention from the use of automatic volume control in order to avoid this objection. That is, it is preferred to apply automatic volume control to certain operating stages of the receiver while using other and different operating stages to provide parallel amplifiers in amplifying the audio frequency or other low frequency signals.

Figure 5:
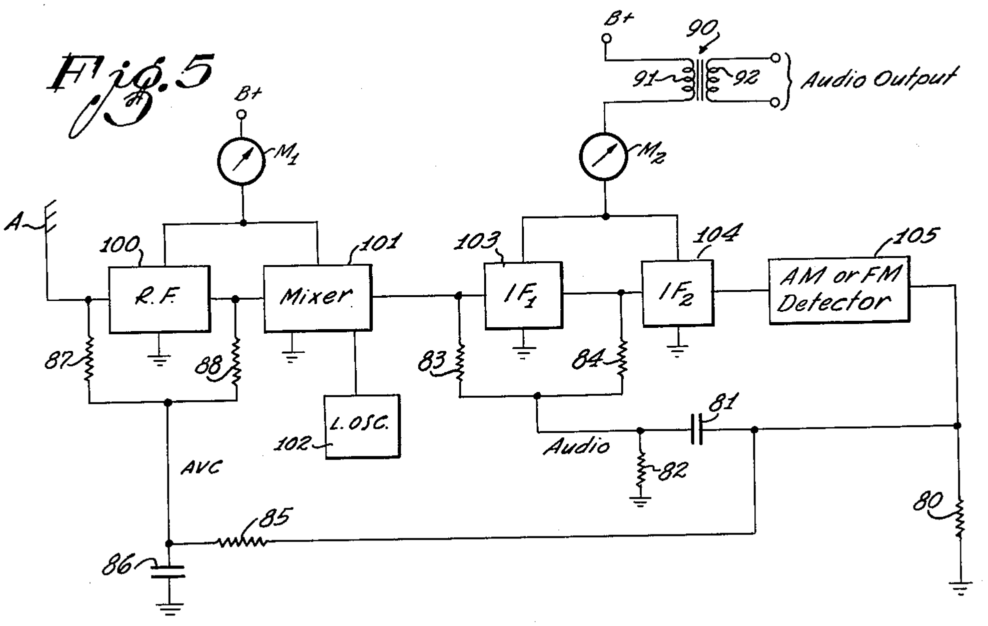
Figure 5 is a block diagram of a radio receiving system illustrating how my invention may be advantageously incorporated therein.

Figure 5 illustrates in block diagram form the utilization of the invention in a radio receiver and provides a better illustration of the above mentioned principle. In Figure 5 the radio receiver is illustrated as including an antenna A which drives a radio frequency amplifier circuit 100 whose output is in turn supplied to a mixer 101. A local oscillator 102 associated with the mixer makes it possible to supply an intermediate frequency signal to amplifier 103 and thence through amplifier 104 to the AM or FM detector 105. A resistor 80 provides a stabilizing load for the detector. The detector output signal is supplied through a series capacitor 81 to a grounded resistor 82 and also through coupling resistors 83, 84 to the signal input circuits of amplifiers 103 and 104, respectively. Capacitor 81 blocks the direct voltage component of the detected signal and assures that only the audio or other low frequency intelligence signal is supplied to 103 and 104. The detected signal is also supplied through a coupling resistor 85 and thence through a parallel pair of coupling resistors 87, 88 to the signal input circuits of the radio frequency amplifier and the mixer. A bypass capacitor 86 coupled between ground and the junction of resistors 85, 87 and 88 assures the elimination of the intelligence signal so that only the varying direct voltage to be used for automatic volume control purposes reaches resistors 87, 88.

In Figure 5 the radio frequency amplifier and mixer are illustrated as having their primary signal circuits coupled together and thence through a current meter $M_1$ to a power source designated as B+. Meter $M_1$ indicates the D.C. or average current in these two operating stages, the value of which is a function of the quiescent current and also of the strength of the incoming carrier wave. The purpose of the automatic volume control circuit in Figure 5 is the same as has been in widespread use for many years, namely, to decrease the gain of the particular operating stages when the incoming carrier becomes stronger, and to increase their gain when the carrier becomes weaker. The direct voltage signal produced by the detector has a value which is proportional to carrier strength and is applied to the earlier operating stages of the receiver to reduce their average current values and also, by virtue of the non-linear operating characteristics of the particular electron discharge devices used, to reduce their gain. The intelligence signal applied through capacitor 81, on the other hand, is not intended in any way to affect the gain of amplifiers 103 and 104 but is merely supplied to them for amplification through the use of what is hoped to be an entirely linear portion of their operating characteristics.

Amplifiers 103 and 104 are illustrated as having their primary signal circuits coupled together and thence through a meter $M_2$ and the primary winding 91 of a transformer 90 to a power supply indicated as B+. Assuming that meter $M_2$ is capable of responding to rapid current variations its reading will then vary in exact accord with the amplified intelligence signal. If meter $M_2$ is not capable of responding to such rapid variations then it will indicate a fixed value representing the average current drawn by amplifier stages 103 and 104, which value will not be affected by changes in the strength of the received carrier wave.

While it is preferred in using my invention to utilize a transformer as the common load for two or more operating stages which act as parallel amplifiers, it is nevertheless possible to use another type of impedance such as, for example, a resistor.

Although my invention is fully capable of achieving the results and providing the advantages hereinbefore mentioned, it is to be understood that it is merely the presently preferred embodiment thereof, and that I do not mean to be limited to the details of construction above described other than as defined in the appended claims.

I claim:

1. A radio receiver system comprising a plurality of operating stages adapted to sequentially accept the received signal, a detector circuit to which the received signal is subsequently applied and operable for producing an intelligence signal therefrom, means associated with said detector circuit for applying to at least one of said operating stages an automatic volume control voltage signal whose amplitude varies with the strength of the received signal, a feedback circuit associated with said detector circuit and operable for applying said intelligence signal simultaneously and in the same phase to two adjacent ones of said operating stages to which said automatic volume control voltage signal is not applied, and means including a common load circuit associated with said two operating stages and enabling them to operate as parallel amplifiers for amplifying said intelligence signal.

2. A radio receiver system as claimed in claim 1 in which said two operating stages are intermediate frequency amplifiers.

3. A radio receiver system as claimed in claim 1 in which said common load circuit includes an audio-frequency transformer.

4. In a radio receiver including at least two amplifier stages adapted to sequentially amplify a modulated high frequency signal, a detector circuit coupled to the last one of said amplifier stages for producing an intelligence signal detected from said high frequency signal, at least one other operating stage preceding said amplifier stages, and circuit means associated with said detector circuit for applying only to the operating stages preceding said two amplifier stages an automatic volume control voltage whose amplitude varies with the strength of the incoming signal received by the receiver, the improvement comprising: a feedback circuit interconnecting said detector circuit with said two amplifier stages and operable for applying said intelligence signal to both of said amplifier stages simultaneously and in the same phase; and a low frequency output circuit coupled to both of said amplifier stages in common and operable for reproducing said intelligence signal in amplified form after amplification thereof by said amplifier stages.

5. In a radio receiver including at least two amplifier stages adapted to sequentially amplify a modulated high frequency signal, a detector circuit for subsequently receiving said high frequency signal and operable for producing an intelligence signal therefrom, at least one other operating stage preceding said amplifier stages, and circuit means associated with said detector circuit for applying only to the operating stages preceding said two amplifier stages an automatic volume control voltage whose amplitude varies with the strength of the incoming signal received by the receiver, the improvement comprising: a feedback circuit interconnecting said detector circuit with said two amplifier stages and operable for applying said intelligence signal to both of said amplifier stages simultaneously and in the same phase, said two amplifier stages being adapted to amplify said intelligence signal concurrently with the modulated high frequency signal; and a low frequency output circuit coupled to both of said amplifier stages in common and operable for reproducing said intelligence signal in amplified form after amplification thereof by said amplifier stages.

6. In a radio receiver including at least two amplifier stages adapted to sequentially amplify a modulated high frequency signal, a detector circuit coupled to the last one of said amplifier stages for producing an intelligence signal detected from said high frequency signal, at least one other operating stage preceding said amplifier stages, and circuit means associated with said detector circuit for applying only to the operating stages preceding said two amplifier stages an automatic volume control voltage whose amplitude varies with the strength of the incoming signal received by the receiver, the improvement comprising: a feedback circuit interconnecting said detector circuit with said two amplifier stages and operable for applying said intelligence signal to both of said amplifier stages simultaneously and in the same phase; and a low frequency output transformer coupled to both of said amplifier stages in common and operable for reproducing said intelligence signal in amplified form after amplification thereof by said amplifier stages.

References Cited in the file of this patent

UNITED STATES PATENTS

| | | |
|---|---|---|
| 1,551,578 | Loye | Sept. 1, 1925 |
| 1,672,037 | Parker | June 5, 1928 |
| 2,204,975 | Thurbach | June 18, 1940 |
| 2,455,711 | Sziklai | Dec. 7, 1948 |
| 2,512,300 | Braak | June 20, 1950 |
| 2,662,170 | Boelens | Dec. 8, 1953 |
| 2,843,735 | Held | July 15, 1958 |

FOREIGN PATENTS

| | | |
|---|---|---|
| 588,479 | Great Britain | May 22, 1947 |